United States Patent [19]
Abe et al.

[11] Patent Number: 5,328,718
[45] Date of Patent: Jul. 12, 1994

[54] PRODUCTION OF BARIUM TITANATE THIN FILMS

[75] Inventors: Yoshio Abe, Kyoto; Yukio Hamaji, Nagaokakyo; Yukio Sakabe, Kyoto, all of Japan

[73] Assignee: Myrata Mfg., Co., Ltd., Japan

[21] Appl. No.: 969,027

[22] Filed: Oct. 30, 1992

[30] Foreign Application Priority Data

Nov. 1, 1991 [JP] Japan .................. 3-315497

[51] Int. Cl.$^5$ ............................. B05D 5/12
[52] U.S. Cl. ..................... 427/126.3; 427/376.2; 427/430.1; 427/443.2; 501/137
[58] Field of Search ............ 427/443.2, 126.3, 79, 427/376.2, 430.1; 501/137

[56] References Cited

U.S. PATENT DOCUMENTS

| | | | |
|---|---|---|---|
| 4,606,906 | 8/1986 | Ritter et al. | 501/137 |
| 4,636,378 | 1/1987 | Pastor et al. | 501/137 |
| 4,710,227 | 12/1987 | Harley et al. | 501/137 |
| 4,764,493 | 8/1988 | Lilley et al. | 501/137 |
| 4,886,654 | 12/1989 | Ohga et al. | 501/137 |
| 4,918,035 | 4/1990 | Inoue et al. | 501/134 |
| 5,017,534 | 5/1991 | Chapur et al. | 501/137 |
| 5,032,559 | 7/1991 | McSweeney et al. | 501/137 |
| 5,087,437 | 2/1992 | Bruno et al. | 501/137 |
| 5,160,762 | 11/1992 | Bruno et al. | 427/126.3 |

OTHER PUBLICATIONS

Fukushimo et al., "Preparation of BaTiO$_3$ Films by Hydrolysis of Organometallic Compounds" Ceramic Bulletin 55 (1976) pp. 1064–1065.

Primary Examiner—Shrive P. Beck
Assistant Examiner—Benjamin L. Utech
Attorney, Agent, or Firm—Ostrolenk, Faber, Gerb & Soffen

[57] ABSTRACT

A thin film of barium titanate is formed on a substrate by immersing the substrate in an aqueous solution containing barium ions and titanium alkoxide. The aqueous solution may contain not more than 20 vol % of one or more alkanolamines expressed by the general formula:

$$HO(C_nH_{2n})mNH_{3-m}$$

where n is not more than 10, and m=1, 2 or 3.

5 Claims, No Drawings

PRODUCTION OF BARIUM TITANATE THIN FILMS

BACKGROUND OF THE INVENTION

1. Field of the Invention

The present invention relates to a method for production of ferroelectric thin films and, more particularly, a method for depositing thin films of barium titanate on desired substrates without use of complex procedures.

2. Description of the Prior Art

Barium titanate, BaTiO3, has been utilized widely for various electronic devices such as, ultrasonic sensors, capacitors, actuators, pyroelectric infrared detectors and nonvolatile memories, because of its superior properties as a ferroelectric, piezoelectric or pyroelectric material. Further, many investigations have been directed to the application of barium titanate to many other fields.

In such devices, barium titanate is generally applied as thin films to make the best use of its properties. For this reason, there have been proposed various methods for production of thin films of barium titanate in various patent documents and literatures such as, JP-A-S61-30678, JP-A- H2-94209, JP-A- H2-258700, and JAPANESE JOURNAL OF APPLIED PHYSICS, Vol. 28, No. 11, 1989.

JP-A- 61-30678 discloses a method including the step of chemically converting a metallic titanium surface serving as a substrate to a barium titanate. However, this method is limited only to metallic titanium as the substrate, thus making it impossible to form thin films of barium titanate on other substrates.

JP-A- H2-94209 discloses a sputtering process in which a material is sputtered from a target and deposited on the substrate. However, sputtering requires use of complex, expensive equipments, resulting in considerable increase of equipment investment.

JP-A- H2-258700 discloses a plasma method utilizing plasma for deposition of thin films. This method requires complex, large-scale equipments and can be applied only to substrates which can withstand high temperatures.

The JAPANESE JOURNAL OF APPLIED PHYSICS discloses a hydrothermal, electrochemical method in which thin films are deposited on a substrate by a wet process at high temperature and high pressure in an autoclave. Since the substrate is used as one of electrodes, this method can be applied only to metal substrates with good conductivity. Further, the formation of thin films is performed at high temperature and pressure, thus making it impossible to apply this process to organic substrates.

On the other hand, it is also known that barium titanate can be produced in a powder form by hydrolyzing titanium alkoxide in a solution containing barium ions at low temperatures. However, it is impossible with the known hydrolyzing process to produce thin film of barium titanate.

SUMMARY OF THE INVENTION

It is therefore an object of the present invention to provide a method for production of thin films of barium titanate, which overcomes the aforesaid disadvantages of the prior art.

Another object of the present invention is to provide a method for production of thin films of barium titanate, which makes it possible to form thin films of barium titanate on any desired substrates simply.

It has now been found that it is possible to produce thin films of barium titanate on a substrate by controlling the rate of hydrolysis of titanium alkoxide.

The above and other objects of the present invention are achieved by providing a method for producing thin films of barium titanate on substrates, which comprises immersing a substrate in an aqueous solution containing barium ions and one or more titanium alkoxide or derivative thereof.

DETAILED DESCRIPTION OF THE PREFERRED EMBODIMENTS

Preferably, the aqueous solution contains not more than 20 vol % of one or more alkanolamines having by the general formula:

$$HO(C_nH_{2n})mNH_{3-m}$$

where n is not more than 10, and m=1, 2 or 3. The alkanolamines include, without being limited to, ethanolamines, propanolamines, butanolamines, etc.

As a source of barium ions, there may be used water-soluble inorganic salts of barium such as barium nitrate, barium chloride, barium sulphate and the like.

As the titanium alkoxide, there may be used those such as titanium butoxide, titanium ethoxide, titanium propoxide and the like. Typical derivatives of titanium alkoxide are titanium alkoxides modified by one or more alkanolamines having by the general formula:

$$HO(C_nH_{2n})mNH_{3-m}$$

where n is not more than 10, and m=1, 2 or 3.

Preferably, the aqueous solution contains barium ions and titanium alkoxide so that their concentrations, when converted into molar concentrations of $Ba^{2+}$ ions and $Ti^{4+}$ ions, respectively, fall within the following respective ranges: 0.01 mM/l$\leq Ba^{2+} \leq$150 mM/l, 0.01 mM/l$\leq Ti^{4+} \leq$500 mM/l.

During film formation of barium titanate, the aqueous solution is preferably maintained at a temperature within the range of 50° to 110° C. during formation the thin films. Further, the pH of the aqueous solution is preferably maintained to a value of not less than 13.

Under suitable reaction conditions including the rate of hydrolysis of titanium alkoxide, ion concentrations of the aqueous solution, reaction temperature, and pH of the solution, heterogeneous nucleation of barium titanate takes place on solid surfaces, i.e., the substrate surface and a surface of the vessel containing the aqueous solution, and the growth of nuclei produces thin films on the substrate. In this case, it is possible to prevent the aqueous solution from homogeneous nucleation, which results in formation of precipitate or powder.

According to the present invention, it is therefore possible to deposit thin films of barium titanate on the substrate surface only by immersing the substrate in the aqueous solution with controlled composition. Thus, the operation of film formation can be considerably simplified.

The present invention will become apparent from the following description in connection with several examples.

EXAMPLE

Guaranteed reagents of barium nitrate, ethanolamine-modified titanium butoxide (hereinafter referred to as "TBEA") and potassium hydroxide were dissolved in ion-exchanged water to prepare aqueous solutions each containing barium ions and TBEA and having a pH value as shown in Table 1. The pH value of each solution was adjusted by controlling an added amount of potassium hydroxide. In Table 1, the concentrations of barium ions and TBEA are listed in concentrations of $Ba^{++}$ and $Ti^{4+}$ ions, and specimens with an asterisk (*) are those out of the scope of the present invention.

The above aqueous solution was added with 5 vol % of triethanolamine to keep the rate of hydrolysis of TBEA constant. Then, three kinds of substrates each with a size of 10×15×2 mm, each being composed of sintered alumina, slide glass or platinum, were respectively immersed in 100 ml of the resultant aqueous solution put in a vessel of polystyrene. The solution was heated to and maintained at a temperature shown in Table 1 for 20 hours to form a thin film of barium titanate thereon.

After removal from taking out of the solution, the substrate was observed as to the existence and quality of thin films deposited thereon.

TABLE 1

| No. | $Ba^{2+}$ (mM/l) | TBEA (mM/l) | pH | Temp. (°C.) |
|---|---|---|---|---|
| 1* | 0.005 | 500 | 12.5 | 110 |
| 2* | 100 | 0.005 | 13.5 | 110 |
| 3 | 0.01 | 0.01 | 14.5 | 110 |
| 4 | 0.1 | 0.1 | 14.5 | 100 |
| 5 | 1 | 1 | 14.5 | 90 |
| 6 | 10 | 10 | 14.1 | 70 |
| 7 | 100 | 100 | 13.5 | 55 |
| 8 | 100 | 1 | 13.5 | 60 |
| 9 | 150 | 0.01 | 14.5 | 80 |
| 10 | 0.01 | 500 | 14.5 | 80 |

For the specimens No. 3 to 10 each employing the aqueous solution falling within the scope of the present invention, it was observed that uniform thin films of barium titanate are deposited on the three kinds of substrates.

In contrast therewith, for the specimens each employing the aqueous solutions containing 0.005 mM/l of $Ba^{++}$ ions (specimen No. 1) or 0.005 mM/l of TBEA (specimen No. 2), uniform thin films were never deposited on the substrate.

Although no data are shown in Table 1, the solution with the $Ba^{2+}$ ion concentration exceeding 150 mM/l, for example, 300 mM/l or the TBEA concentration exceeding 500 mM/l, for example, 700 mM/l, did not provide thin films of barium titanate and resulted in formation of powdered barium titanate (precipitate). This results from the fact that uniform nucleation of barium titanate takes place in the solution.

For the reasons mentioned above, it is preferred to use the aqueous solution containing 0.01 to 150 mM/l of $Ba^{2+}$ ions and 0.01 to 500 mM/l, in term of $Ti^{4+}$ ions, of titanium alkoxide.

Further, if the temperature of the aqueous solution is less than 50° C., crystalline thin films of barium titanate are never obtained. If the temperature of the aqueous solution exceeds 110° C., the substrate surface is cut off from the solution by bubbles attached thereto, resulting in considerable decrease of the continuity and uniformity of thin films. Thus, it is preferred to control the temperature of the aqueous solution to 50° to 110° C. during the formation of thin films of barium titanate.

Further, if the pH value of the aqueous solution is less than 13, undesired phases other than barium titanate are produced during film formation. For this reason, the pH value of the aqueous solution is preferably adjusted to 13 or above.

In the above example, plates composed of sintered alumina, slide glass and platinum are used as the substrates for formation of barium titanate films. However, any other material may be used as a substrate for formation of barium titanate films. Further, the substrates may have any configuration such as, for example, spheres, fibers, sponge-like members, without being limited to plates, films, foils and the like.

As will be understood from the above, according to the present invention, barium titanate thin films can be produced only by immersing the substrate in the aqueous solution, thus making it possible to produce uniform thin films of barium titanate on any desired substrate regardless of its complex configuration. In addition, it is possible with the present invention to produce dense, uniform ferroelectric thin films of barium titanate easily and economically.

Further, since the barium titanate thin films can be directly deposited on the substrate surface regardless of configuration or shape and kind of the substrate, it is possible to select a substrate material and configuration of from wide ranges, which in turn makes it possible to expand the area of application of barium titanate thin films.

Although the present invention has been fully described in connection with the preferred examples, it is to be noted that various changes and modifications, which are apparent to those skilled in the art, are to be understood as included within the scope of the present invention as defined by the appended claims unless they depart therefrom.

What is claimed is:

1. A method for producing a thin film of barium titanate on a substrate, comprising the step of immersing a substrate in an aqueous solution containing barium ions and alkanolamine-modified titanium alkoxide under reaction conditions such that heterogeneous nucleation of barium titanate takes place on the substrate.

2. The method according to claim 1, wherein said aqueous solution contains not more than 20 vol % of one or more alkanolamines having the general formula:

$$HO(C_nH_{2n})_mNH_{3-m}$$

where n is not more than 10, and m=1, 2 or 3.

3. The method according to claim 1, wherein said aqueous solution contains barium ions and titanium alkoxide in amounts, when respectively converted into molar concentrations of $Ba^{2+}$ ions and $Ti^{4+}$ ions, falling within the following respective ranges:

$$0.01 \text{ mM/l} \leq Ba^{2+} \leq 150 \text{ mM/l},$$

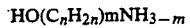

$$0.01 \text{ mM/l} \leq Ti^{4+} \leq 500 \text{ mM/l}.$$

4. The method according to claim 1, further comprising the step of maintaining said aqueous solution at a temperature within the range of 50° to 110° C.

5. The method according to claim 1, wherein said aqueous solution has a pH value not less than 13.

* * * * *

UNITED STATES PATENT AND TRADEMARK OFFICE
CERTIFICATE OF CORRECTION

PATENT NO. : 5,328,718
DATED : July 12, 1994
INVENTOR(S) : Yoshio Abe, et. al.

It is certified that error appears in the above-indentified patent and that said Letters Patent is hereby corrected as shown below:

Title page, item [73], Assignee: should read --Murata Mfg., Co., Ltd., Japan--.

Signed and Sealed this

Eleventh Day of October, 1994

Attest:

BRUCE LEHMAN

Attesting Officer     Commissioner of Patents and Trademarks